US009425114B2

(12) United States Patent
Bet-Shliemoun

(10) Patent No.: US 9,425,114 B2
(45) Date of Patent: Aug. 23, 2016

(54) FLIP CHIP PACKAGES

(71) Applicant: Oracle International Corporation, Redwood City, CA (US)

(72) Inventor: Ashur Bet-Shliemoun, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 14/671,201

(22) Filed: Mar. 27, 2015

(65) Prior Publication Data

US 2015/0279761 A1 Oct. 1, 2015

Related U.S. Application Data

(60) Provisional application No. 61/971,948, filed on Mar. 28, 2014.

(51) Int. Cl.
| H01L 23/34 | (2006.01) |
| H01L 23/04 | (2006.01) |
| H01L 23/42 | (2006.01) |
| H01L 23/00 | (2006.01) |
| H01L 23/36 | (2006.01) |
| H01L 29/06 | (2006.01) |

(Continued)

(52) U.S. Cl.
CPC ............... *H01L 23/04* (2013.01); *H01L 23/36* (2013.01); *H01L 23/4006* (2013.01); *H01L 23/42* (2013.01); *H01L 24/17* (2013.01); *H01L 29/0657* (2013.01); *H01L 23/40* (2013.01); *H01L 23/473* (2013.01); *H01L 2224/16227* (2013.01); *H01L 2224/73204* (2013.01); *H01L 2224/73253* (2013.01); *H01L 2924/0665* (2013.01); *H01L 2924/10253* (2013.01); *H01L 2924/15311* (2013.01); *H01L 2924/16251* (2013.01)

(58) Field of Classification Search
CPC .............. H01L 23/36; H01L 23/49568; H01L 23/4006; H01L 23/42; H01L 24/17; H01L 29/0657
USPC .................... 257/719, 707, 713, 778, E23.051
See application file for complete search history.

(56) References Cited

U.S. PATENT DOCUMENTS

| 5,926,371 | A | * | 7/1999 | Dolbear | ............... | H01L 23/4006 |
| | | | | | | 174/138 G |
| 6,114,761 | A | * | 9/2000 | Mertol | ................... | H01L 23/367 |
| | | | | | | 257/706 |
| 6,144,101 | A | * | 11/2000 | Akram | .................... | H01L 23/50 |
| | | | | | | 257/707 |

(Continued)

OTHER PUBLICATIONS

Brian Smith et al., Design of Thermal Interfaces With Embedded Microchannels to Control Bond Line Formation, IBM Research, GmbH, Zurich Research Laboratory, Rueschlikon, Switzerland, 2008, pp. 410-418.

(Continued)

*Primary Examiner* — Nitin Parekh
(74) *Attorney, Agent, or Firm* — Brooks Kushman P.C.

(57) ABSTRACT

A flip chip package includes a substrate, a silicon die supported on and electrically connected with the substrate, and a lid attached with the substrate and covering the silicon die. The silicon die has a die surface including a first set of tracks formed therein, and the lid may have a lid surface including a second set of tracks formed therein. A thermal interface material may be disposed between the die surface and lid surface and at least partially fill the first and second sets of tracks.

10 Claims, 3 Drawing Sheets

(51) Int. Cl.
*H01L 23/40* (2006.01)
*H01L 23/473* (2006.01)

(56) References Cited

U.S. PATENT DOCUMENTS

| | | | |
|---|---|---|---|
| 6,437,240 B2* | 8/2002 | Smith | 174/541 |
| 6,653,730 B2* | 11/2003 | Chrysler | H01L 23/36 257/704 |
| 6,836,408 B2 | 12/2004 | Gektin et al. | |
| 7,002,246 B2 | 2/2006 | Ho et al. | |
| 7,030,484 B1 | 4/2006 | Zheng et al. | |
| 7,515,426 B2 | 4/2009 | Depew | |
| 7,944,698 B2 | 5/2011 | Colbert et al. | |
| 7,982,478 B2 | 7/2011 | Abazarnia et al. | |
| 8,368,194 B1 | 2/2013 | Darveaux et al. | |
| 2003/0085453 A1 | 5/2003 | Eyman et al. | |
| 2003/0226253 A1* | 12/2003 | Mayer | B23K 1/0016 29/832 |
| 2004/0036162 A1* | 2/2004 | Chuang | H01L 23/367 257/717 |
| 2004/0266068 A1* | 12/2004 | Matayabas, Jr. | H01L 23/3121 438/127 |
| 2005/0127484 A1 | 6/2005 | Wills | |
| 2010/0019379 A1* | 1/2010 | Zhao | H01L 21/4871 257/713 |
| 2012/0074589 A1 | 3/2012 | Mardi et al. | |
| 2012/0309132 A1 | 12/2012 | Gaynes et al. | |
| 2014/0264799 A1* | 9/2014 | Gowda | H01L 23/3677 257/675 |

OTHER PUBLICATIONS

Fei Ding, Flip Chip and Lid Attachment Assembly Process Development, a Dissertation, Auburn University, Auburn Alabama, Dec. 15, 2006, 127 pgs.

R.J. Linderman et al., Hierarchical Nested Surface Channels for Reduced Particle Stacking and Low-Resistance Thermal Interfaces, IBM Research GmbH, Zurich Research Laboratory, Ruschlikon, Switzerland, 2007, 8 pgs.

T. Brunschwiler et al., Hierarchically Nested Channels for Fast Squeezing Interfaces With Reduced Thermal Resistance, IBM Zurich Research Laboratory, Ruschlikon, Switzerland, 2005, 8 pgs.

Cullen E. Bash et al., Improving Heat Transfer From a Flip-Chip Package, Article 16, Hewlett-Packard Journal, Aug. 1997, pp. 1-7.

Thermal Management and Mechanical Handling for Lidless Flip Chip Ball-Grid Array, Altera Corporation, San Jose, California, Mar. 2012, pp. 1-14.

* cited by examiner

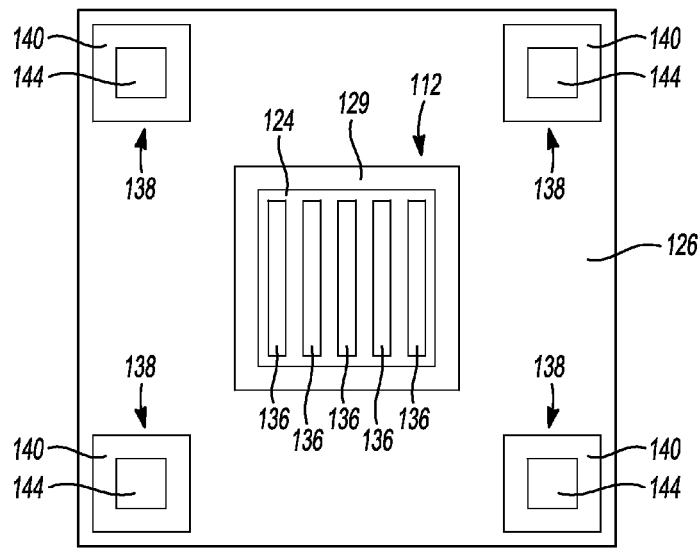
Fig-3
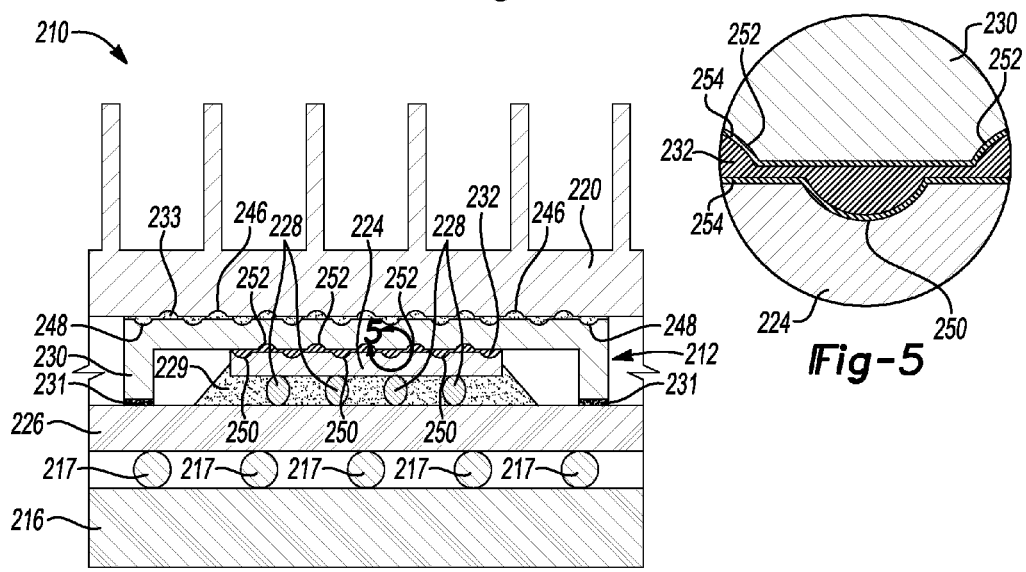
Fig-4
Fig-5

FLIP CHIP PACKAGES

CROSS-REFERENCE TO RELATED APPLICATION

This application claims the benefit of Provisional Application No. 61/971,948, filed Mar. 28, 2014, which is hereby incorporated by reference in its entirety.

TECHNICAL FIELD

This disclosure relates to flip chips and the packaging thereof.

BACKGROUND

Flip chip assemblies interconnect semiconductor devices, such as integrated circuit chips and microelectromechanical systems (MEMS), to external circuitry with solder bumps that have been deposited onto the chip pads. These bumps are deposited on the chip pads on the top side of the wafer during final wafer processing. To mount the chip to external circuitry, such as a circuit board or another chip, it is inverted so that its top side faces down, and aligned so that its pads align with matching pads on the external circuit. The solder is then re-melted to produce an electrical connection, typically using a Thermosonic bonding or other reflow solder process. This leaves a small space between the chip's circuitry and the underlying mount. A dielectric adhesive may then be used to fill (underfill) this space to increase the strength of the mechanical connection and reduce stress on the solder joints due to thermal expansion differences between the chip and its surrounding elements: the underfill distributes forces generated during thermal expansion, which hinders stress concentration at the solder joints.

Flip chip assemblies are typically smaller than traditional carrier-based systems because the chip sits directly on the circuit board. Associated shorter wires reduce inductance, which allows higher-speed signals and better heat conduction. As such, flip chip assemblies can be well suited for a variety of electronic products.

SUMMARY

A lid-less flip chip package includes a substrate, a silicon die supported on and electrically connected with the substrate, and one or more support structures supported on the substrate and positioned around the silicon die without covering the silicon die. The silicon die and support structures cooperate to support a heat sink such that the silicon die and support structures distribute compression loads associated with the heat sink to the substrate.

The package may further include solder bumps and underfill disposed between the silicon die and substrate. Each of the support structures may comprise silicon, solder bumps and underfill. The support structures may comprise non-silicon materials. The package may further include a thermally conductive layer on the silicon die. The layer may comprise a metal, graphite, thermal epoxy, thermal film or thermal pad. The package may further include a thermally conductive medium on the silicon die. The thermally conductive medium may be a cooling liquid. The silicon die may have a side including one or more tracks formed therein and positioned to be adjacent to the heat sink. The package may further include a thermally conductive layer on the side and at least partially filling the tracks. The package may further include a seed metal coating the tracks. A distance from the substrate to a top of each of the support structures may be equal to or less than a distance from the substrate to a top of the silicon die.

A flip chip package includes a substrate and a silicon die supported on and electrically connected with the substrate. The silicon die has a die surface including a first set of tracks formed therein configured to receive a thermal interface material. The package further includes a lid attached with the substrate and covering the silicon die.

The lid may have a lid surface including a second set of tracks formed therein configured to receive a thermal interface material. The die surface and lid surface may be adjacent to one another. The package may further include a thermal interface material disposed between the die surface and lid surface and at least partially filling the first and second sets of tracks. The thermal interface material may be a cooling liquid. The package may further include a seed metal coating the first set of tracks.

A flip chip package and heat sink assembly includes a substrate, a silicon die supported on and electrically connected with the substrate, a lid attached with the substrate and covering the silicon die, and a heat sink configured to apply a load to the lid, silicon die and substrate. The silicon die has a die surface adjacent to the lid. The lid has a first lid surface adjacent to the silicon die and a second lid surface adjacent to the heat sink. The heat sink has a sink surface adjacent to the lid. At least one of the die, first lid, second lid and sink surfaces has tracks formed therein configured to receive a thermal interface material.

The package may further include a thermal interface material disposed within some of the tracks. The package may further include a thermally conductive medium on the silicon die.

BRIEF DESCRIPTION OF THE DRAWINGS

FIG. 3 is a plan view of the lid-less flip chip package of FIG. 2.

FIG. 4 is a side view, in cross-section, of another lidded flip chip package and heat sink assembly.

FIG. 5 is a side view, in cross-section, of a portion of the lidded flip chip package and heat sink assembly of FIG. 4.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
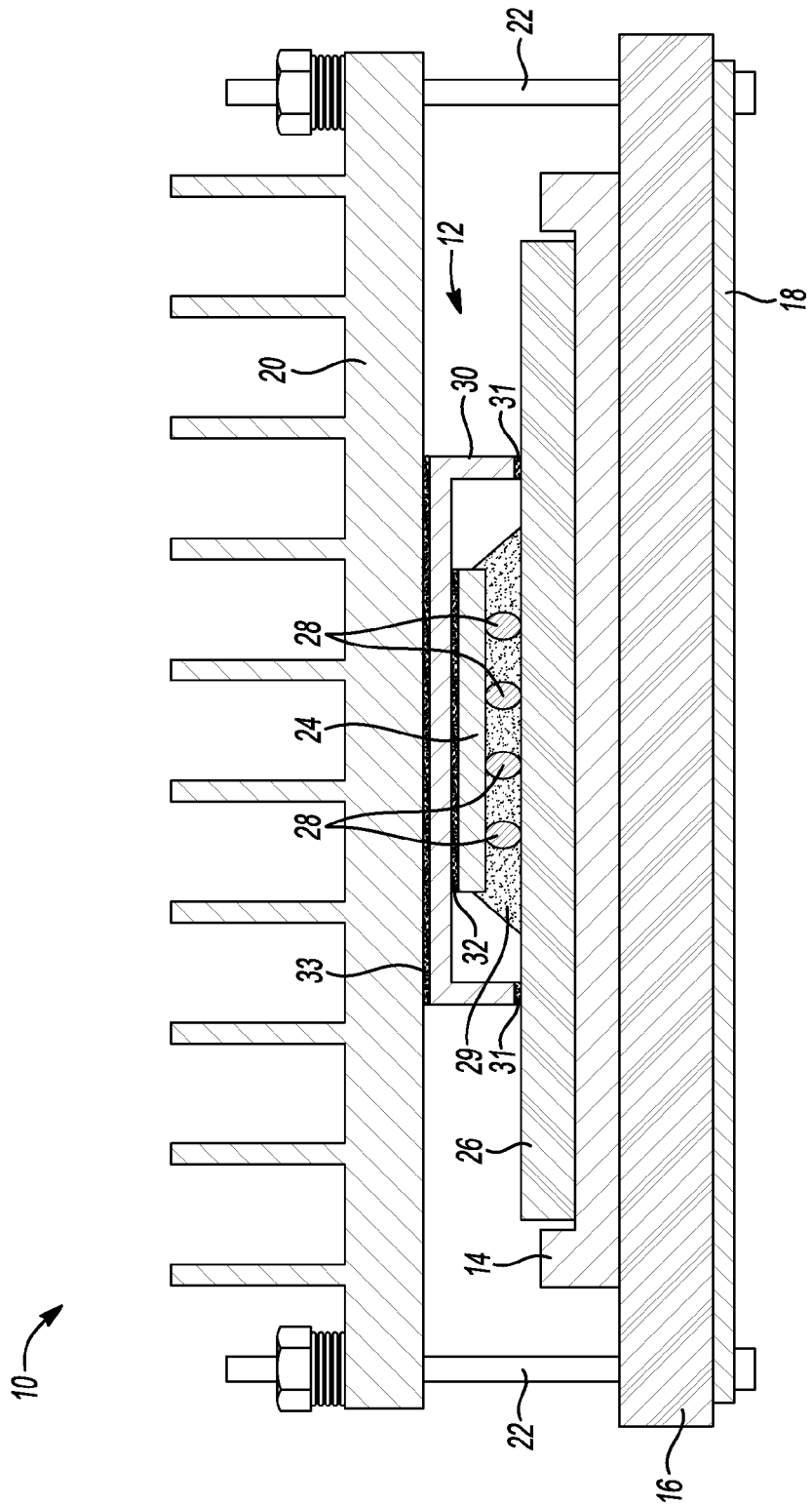
FIG. 1 is a side view, in cross-section, of a prior art lidded flip chip package and heat sink assembly.

With reference to FIG. 1, a typical prior art lidded flip chip package and heat skink assembly 10 includes a flip chip assembly 12 contained within a socket 14 on a printed circuit board (PCB) 16. (A ball grid array may also be used instead of the socket 14, etc.) The assembly 10 further includes a bolster plate 18 on which the PCB 16 is mounted and a heat sink 20. The heat sink 20 is fastened to the bolster plate 18 via spring-loaded bolt assemblies 22 to compress the flip chip assembly 12, socket 14 and PCB 16 there between to enhance the thermal path between the flip chip assembly 12 and heat sink 20, and/or to enhance the electrical connections associated with the socket 14.

The flip chip assembly 12 includes a silicon die 24 mounted to a package substrate 26 via solder bumps 28 and underfill 29. The flip chip assembly 12 further includes a lid 30 bonded to the package substrate 26 via, for example, an epoxy 31, and covering the silicon die 24. A thermal interface material 32 is disposed between the silicon die 24 and lid 30. And, a thermal interface material 33 is disposed between the heat sink 20 and lid 30. The thermal interface materials 32, 33 may be the same or different depending on application objectives. Heat from the silicon die 24 conducts through the thermal interface material 32, lid 30, and thermal interface material 33 to the heat sink 20.

The distance between the spring-loaded bolt assemblies 22 relative to the much narrower width of the lid 30 supporting the heat sink 20 may cause the heat sink 20 to cock relative to the PCB 16 and bolster plate 18. This condition may be even more likely for lid-less assemblies given that silicon dies are narrower than corresponding lids. Even though the spring-loaded bolt assemblies 22 can accommodate a certain amount of non-coplanarity between the bolster plate 18 and heat sink 20 while sufficiently compressing the flip chip assembly 12 therebetween, such non-coplanarity may affect heat transfer between the flip chip assembly 12 and heat sink 20, as well as long-term wear and durability. Moreover, increases in silicon power may require increased heat conductivity between the heat sink 20 and silicon die 24 to achieve desired cooling.

Certain embodiments disclosed herein may include support arrangements spanning between, for example, a printed circuit board and heat sink to reduce stresses on associated silicon dies and package substrates during manufacturing, testing and operation. In these or other embodiments, patterned cuts, drill trenches, holes, grooves, etc. ("tracks") may be chemically or mechanically etched or otherwise made on the backside of the silicon die or wafer, lid surfaces (to the extent the package includes a lid), and/or heat sink surface to increase the effective surface area of the thermal interface. In liquid cooling arrangements for example, these increased surface areas that are in contact with the cooling liquid can improve heat transfer.

The tracks may form a grid, spiral, parallel line or other pattern. Thermal interface materials, such as alloys, cooling liquids (in liquid cooling arrangements), metals, thermal epoxies, thermal films, thermal pads or thermal preforms may fill the tracks. Some thermal interface materials may be applied to fill the tracks prior to lid or heat sink installation. The tracks may be coated or sputtered with seed metal, such as titanium or tungsten followed by nickel or gold, prior to filling with solder or other metal/metal alloys.

Figure 2:
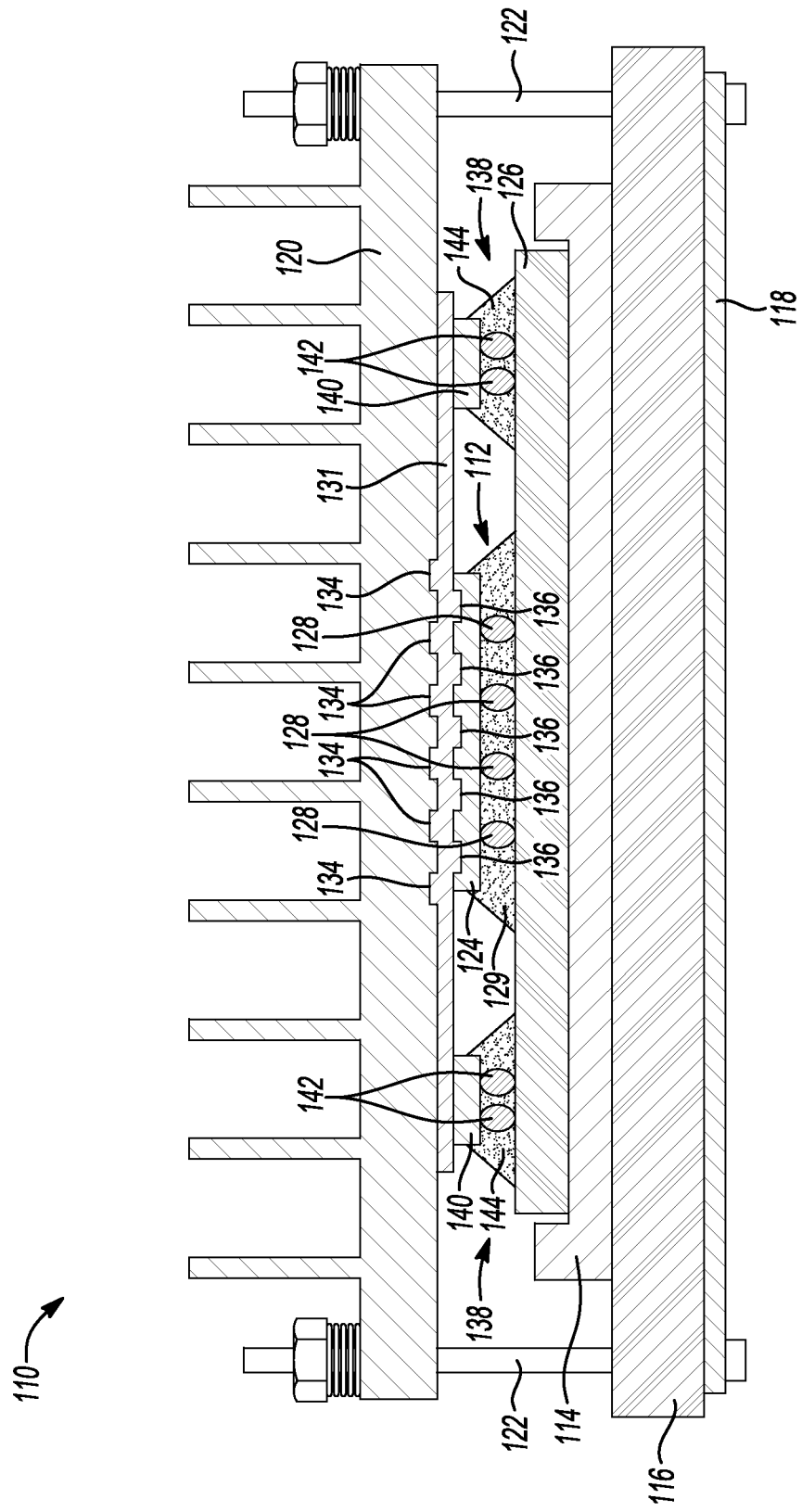
FIG. 2 is a side view, in cross section, of a lid-less flip chip package and heat sink assembly.

With reference to FIG. 2, a lid-less flip chip package and heat sink assembly 110 may include a flip chip assembly 112 contained within a socket 114 on a printed circuit board (PCB) 116. (A ball grid array may also be used instead of the socket 114, etc.) The assembly 110 may further include a bolster plate 118 on which the PCB 116 is mounted and a heat sink 120. The heat sink 120 is fastened to the bolster plate 118 via spring-loaded bolt assemblies 122 to compress the flip chip assembly 112, socket 114 and PCB 116 therebetween. In certain circumstances, up to 400 pounds per square inch of pressure (or more) may be applied to the flip chip assembly 112.

The flip chip assembly 112 includes a silicon die 124 mounted to a package substrate 126 (e.g., a ceramic substrate) via solder bumps 128 and underfill 129. Other mounting techniques, of course, are also contemplated. An indium or indium-gallium foil, graphite film, thermal epoxy, thermal film, thermal pad, etc. 131, in this embodiment, is disposed between the heat sink 120 and silicon die 124 to promote heat transfer therebetween. Additionally the foil or film 131, which may range in thickness from 4 to 8 thousandths of an inch depending on design constraints and objectives (other thicknesses are also possible), may act as a cushion to maintain thermal contact between the heat sink 120 and silicon die 124 even though these two components may be non-coplanar relative to one another. In other embodiments, the heat sink 120 (or a cooling plate in liquid cooling arrangements) may be in direct contact with the silicon die 124.

The heat sink 120 and silicon die 124 have tracks 134, 136 respectively formed on adjacent surfaces to increase the effective surface area for heat transfer. The tracks 134, 136, which may take any suitable shape in cross-section, have a width and depth selected, in this embodiment, such that the foil or film 131 flows into and fills the tracks 134, 136 upon installation of the heat sink 120. The width and depth of the tracks 134, 136, however, may be different in other embodiments. The tracks 134 may extend, for example, at least half-way into the heat sink 120, etc. Other embodiments may include tracks on either of the heat sink 120 or silicon die 124, or may lack tracks all together depending on expected operating temperatures and target heat transfer rates between these components.

With reference to FIG. 3 (and continued reference to FIG. 2), support arrangements 138 are positioned around a perimeter of the flip chip assembly 112 on the package substrate 126: the support arrangements 138 are located at the corners of the package substrate 126. The foil or film 131 as illustrated in FIG. 2 is of sufficient size to cover the support arrangements 138. The foil or film 131 in other embodiments, however, may only cover the silicon die 124. Other scenarios are also possible. Assuming, for example, that the area of the silicon die 124 is 529 square millimeters, the support area of each of the support arrangements 138 may be 25 square millimeters. The shape, location and number of the support arrangements 138 may vary with design. Moreover, the support area defined by the support arrangements 138 may vary with design.

The height of the support arrangements 138, in this example, is the same as the height of the flip chip assembly 112. Certain silicon dies, however, may exhibit crowning such that the center of the die is located slightly further away from the package substrate as compared with its corners depending on die size. The height of the support arrangements 138, in these or other embodiments, may be slightly less than that of the flip chip assembly 112 (e.g., less than 1 thousandth of an inch) to ensure that the heat sink 120 achieves and maintains full contact with the silicon die 124. A typical distance between the heat sink 120 and the package substrate 126 falls within the range of 4 to 9 millimeters. Other distances, however, are possible in different arrangements.

Because the support arrangements 138 span the distance between the package substrate 126 and foil or film 131/heat sink 120, they assist in keeping a planar mounting surface of the heat sink 120, which includes the tracks 134, generally parallel to the package substrate 126 and thus the silicon die 124. Such even contact between the heat sink 120 and silicon die 124 (and foil or film 131 if present) promotes favorable heat transfer characteristics therebetween and reduces uneven stress distribution within the flip chip assembly 112. Additionally, the support arrangements 138 may act as a barrier to prevent unintended contact between the flip chip assembly 112 and various tooling during assembly and test as well as provide additional area for part marking and identification.

Each of the support arrangements 138 includes a silicon die 140 mounted to the package substrate 126 via solder bumps 142 and underfill 144. That is, the support arrangements 138 generally mimic the construction of the flip chip assembly 112. The silicon die 140 may be a "dummy" silicon die or contain active or passive circuitry. Other support structures, however, may be used. Non-silicon (e.g., metal, etc.) rings of sufficient thickness, for example, may be used to similarly support the heat sink 120. The support arrangements 138 illustrated in FIG. 2, however, may offer improved dimensional control relative to alternative constructions: the desired height of the support arrangements 138 may be achieved with greater precision during manufacturing if the support arrangements 138 are constructed similarly to the flip chip assembly 112.

With reference to FIGS. 4 and 5, a lidded flip chip package and heat sink assembly 210 includes a flip chip assembly 212, mounted on on a printed circuit board (PCB) 216 via a ball grid array 217. The assembly 210 further includes a heat sink 220. The flip chip assembly 212 includes a silicon die 224 mounted to a package substrate 226 via solder bumps 228 and underfill 229. The flip chip assembly 212 further includes a lid 230 bonded to the package substrate 226 via, for example, an epoxy 231, and covering the silicon die 224. Support structures (not shown) may or may not be included.

Mating surfaces of the heat sink 220 and lid 230 include tracks 246, 248 respectively formed therein. Likewise, mating surfaces of the silicon die 224 and lid 230 include tracks 250, 252 respectively formed therein. Other embodiments may include tracks on any one or more of the mating surfaces. The mating surfaces including the tracks 250, 252 are coated with a seed metal 254. (In other examples, the seed metal 254 may, of course, be absent.) A thermal interface material 232 (e.g., metal) is disposed between the silicon die 224 and lid 230, and fills the tracks 250, 252. Another thermal interface material 233 (e.g., thermal epoxy) is disposed between the heat sink 220 and lid 230, and fills the tracks 246, 248. The mating surfaces of the silicon die 224 and/or lid 230, in certain arrangements, may come in contact with liquid coolant. For example, a cooling liquid from a cooling plate may be supplied to one or more of the mating surfaces.

While exemplary embodiments are described above, it is not intended that these embodiments describe all possible forms encompassed by the claims. As an example, fastening techniques other than spring-loaded bolt assemblies may of course be used to attach the heat sink to the rest of the package: spring loaded clips may be used to attach a printed circuit board having a flip chip assembly mounted thereon with a heat sink. Other arrangements are also contemplated.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications. Moreover, use of the word "or" in the claims does not imply combinations of the listed elements.

What is claimed:

1. A lid-less flip chip package comprising:
   a substrate;
   a silicon die supported on and electrically connected with the substrate; and
   one or more support structures supported on the substrate and positioned around the silicon die without covering the silicon die, wherein the silicon die and support structures cooperate to support a heat sink such that the silicon die and support structures distribute compression loads associated with the heat sink to the substrate, wherein the silicon die has a side including one or more tracks formed therein, and wherein the side is positioned to be adjacent to the heat sink.

2. The package of claim 1 further comprising solder bumps and an underfill disposed between the silicon die and substrate.

3. The package of claim 1, wherein each of the support structures comprises silicon, solder bumps and underfill.

4. The package of claim 1, wherein the support structures comprise non-silicon materials.

5. The package of claim 1 further comprising a thermally conductive layer on the silicon die.

6. The package of claim 5, wherein the layer comprises a metal, graphite, thermal epoxy, thermal film or thermal pad.

7. The package of claim 1 further comprising a thermally conductive medium on the silicon die, wherein the thermally conductive medium is a cooling liquid.

8. The package of claim 1 further including a thermally conductive layer on the side and at least partially filling the tracks.

9. The package of claim 1 further comprising a seed metal coating the tracks.

10. The package of claim 1, wherein a distance from a top surface of the substrate to a top of each of the support structures is equal to or less than a distance from the top surface of the substrate to a top of the silicon die.

* * * * *